United States Patent [19]

Guo et al.

[11] Patent Number: 5,301,147
[45] Date of Patent: Apr. 5, 1994

[54] STATIC RANDOM ACCESS MEMORY CELL WITH SINGLE LOGIC-HIGH VOLTAGE LEVEL BIT-LINE AND ADDRESS-LINE DRIVERS

[75] Inventors: Ta-Pen Guo, Cupertino; Adi Srinivasan, Fremont, both of Calif.

[73] Assignee: Aptix Corporation, San Jose, Calif.

[21] Appl. No.: 2,776

[22] Filed: Jan. 8, 1993

[51] Int. Cl.⁵ .................................... G11C 11/00
[52] U.S. Cl. ............................ 365/154; 365/156; 365/190; 365/202
[58] Field of Search ............ 365/154, 156, 190, 202, 365/203

[56] References Cited

U.S. PATENT DOCUMENTS

| | | | |
|---|---|---|---|
| 4,499,560 | 2/1985 | Brice | 365/154 |
| 4,750,155 | 6/1988 | Hsieh | 365/203 |
| 4,872,141 | 10/1989 | Plus et al. | 365/154 |

*Primary Examiner*—Eugene R. LaRoche
*Assistant Examiner*—Tan Nguyen
*Attorney, Agent, or Firm*—D'Alessandro, Frazzini & Ritchie

[57] ABSTRACT

A static random access memory cell according to the present invention comprises first and second cross-coupled inverters. The first inverter includes a first P-Channel MOS transistor having a source connected to a first power supply node, a gate, and a drain, and a first N-Channel MOS transistor having a drain connected to the drain of the first P-Channel MOS transistor and forming an output node, a gate, and a source connected to a fixed power supply potential. The second inverter includes a second P-Channel MOS transistor having a source connected to the first power supply node, a gate, and a drain, and a second N-Channel MOS transistor having a drain connected to the drain of the second P-Channel MOS transistor, a gate, and a source connected to the fixed power supply potential. The gates of the first P-Channel and N-Channel MOS transistors are connected to the common drains of the second P-Channel and N-Channel MOS transistors and the gates of the second P-Channel and N-Channel MOS transistors are connected to the common drains of the first P-Channel and N-Channel MOS transistors to form the cross coupling connections. A pass transistor is connected between the output node of the memory cell and a bitline. Circuitry is provided to provide a first power supply potential during a read operation and a second power supply potential during a write operation to the first power supply node. The first power supply potential is higher than the second power supply potential.

3 Claims, 2 Drawing Sheets

STATIC RANDOM ACCESS MEMORY CELL WITH SINGLE LOGIC-HIGH VOLTAGE LEVEL BIT-LINE AND ADDRESS-LINE DRIVERS

BACKGROUND OF THE INVENTION

1. Field of the Invention

The present invention relates to static random access memory devices. More particularly, the present invention relates to a static random access memory cell which may be reliable read and written.

2. The Prior Art

The implementation of Static Random Access Memory (SRAM) cells from cross-coupled inverters using CMOS logic is well known in the prior art. Cell reliability is an important design consideration for SRAM cells. One way of evaluating the reliability of an SRAM memory cell is to observe the content of the cell as it is accessed. During a read operation, it is desired that the data contained in the memory cell remains unchanged. In addition, during a write operation it is important that the intended data is actually written into the memory cell.

A typical SRAM cell is configured from cross-coupled inverters coupled to a bitline through a pass transistor connected to an output node of the cell comprising the common drain connection of the complementary MOS transistors of one of the inverter pairs. The SRAM cell is accessed for a read or write operation by applying a voltage potential to the gate of the pass transistor so that the content of the cell may be read or altered. Ensuring that writes occur as intended and that reads do not change the content of the SRAM cell depends upon the sizing of the inverter transistors and the pass transistor. The appropriate sizing of these transistors, however, presents a significant design problem in that the ideal sizing of these transistors for a read operation is in conflict with the ideal sizing for a write operation.

The prior art has provided numerous compromises to attempt to deal with this design problem. An illustrative prior art approach is set forth in U.S. Pat. No. 4,750,155, which provides three suggested solutions to this problem. According to a first approach, the rise time of the voltage to the gate of the pass transistor is greatly increased. To increase the rise time of the pass transistor, a weak address driver pull-up transistor is used. This reduces the coupling of the bitline to the output node of the inverter, however, it also severely limits performance of the memory cell.

According to a second approach, the bitline is precharged during a read operation to a trigger voltage for the inverter coupled to the output node of the cell. In doing so, the voltage at the output node of this inverter, which for a logic low is set by the division of the voltage between the voltage on the bitline and ground by a resistive divider comprising the channel on resistances of the pass transistor and the N-Channel MOS transistor in the inverter, is kept lower than the trigger voltage, thus ensuring that the voltage at the output node of the inverter remains low. Conversely, for a logic high at the output node of the inverter, which is set by the division of the voltage between the voltage on the bitline and Vcc by the resistive divider comprising the equivalent channel on resistances of the pass transistor and the P-Channel MOS transistor in the inverter, the voltage at the output node of the cell is kept higher than the trigger voltage, thus ensuring that the cell output voltage remains high.

This approach has several severe limitations. The first limitation is that it is critical that the trigger voltage be accurately maintained at the inverter trigger point for all memory cells, across all process variations. Since this scheme uses a reference inverter to set the trigger voltage for each bitline, the same trigger voltage is applied to each memory cell along the bitline. Due to the normally-encountered process variations among inverters along the bitline, the trigger point of each of the memory cells will be slightly different, and as such will not match the trigger voltage on the bitline. A greater limitation is that the noise margin on the bitline is approximately zero. Hence, any bitline noise or coupling may disturb the cell content during a read operation, and will make sensing the bitline level difficult.

According to a third approach disclosed in this patent, the channel resistance of the pass transistor is varied depending upon whether a read or write operation occurs. The channel resistance of the pass transistor is varied by changing the voltage level supplied to its gate. During a read operation the gate voltage of the pass transistor is dropped to a trigger voltage level corresponding to the trigger point of a reference inverter. This scheme addresses some of the problems present in the above described approaches, however, it has drawbacks of its own. One limitation is that the size of the inverters in the memory cell and the corresponding reference inverter are critical, and these sizes are affected by process variations. A second limitation is that this approach significantly increases the layout area due to the fact that each bitline needs a trigger voltage level supply generator and a modified driver.

There remains a need for an SRAM memory cell which overcomes these drawbacks of prior art SRAM memory cells. It is an object of the present invention to provide such a memory cell.

BRIEF DESCRIPTION OF THE INVENTION

A static random access memory cell according to the present invention comprises first and second cross-coupled inverters. The first inverter includes a first P-Channel MOS transistor having a source connected to a first power supply node, a gate, and a drain, and a first N-Channel MOS transistor having a drain connected to the drain of the first P-Channel MOS transistor and forming an output node, a gate, and a source connected to a fixed power supply potential. The second inverter includes a second P-Channel MOS transistor having a source connected to the first power supply node, a gate, and a drain, and a second N-Channel MOS transistor having a drain connected to the drain of the second P-Channel MOS transistor, a gate, and a source connected to the fixed power supply potential. The gates of the first P-Channel and N-Channel MOS transistors are connected to the common drains of the second P-Channel and N-Channel MOS transistors and the gates of the second P-Channel and N-Channel MOS transistors are connected to the common drains of the first P-Channel and N-Channel MOS transistors to form the cross coupling connections. A pass transistor is connected between the output node of the memory cell and a bitline. Means are provided to provide a first voltage supply potential during a read operation and a second voltage supply potential during a write operation to the first power supply node. The first voltage supply potential is higher than the second voltage supply potential.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
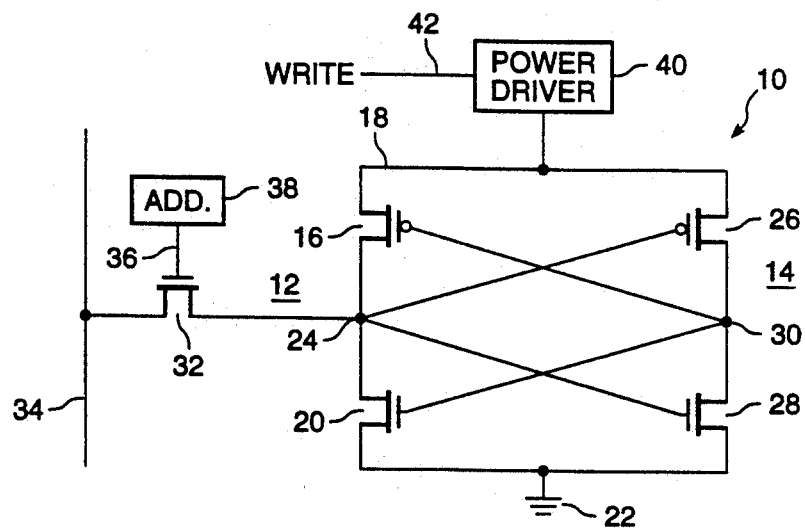
FIG. 1 is a combination block and schematic diagram of an SRAM memory cell according to the present invention.

Referring first to FIG. 1, a preferred embodiment of the present invention is shown in combined block and schematic diagram form. The memory cell 10 of the present invention is a four transistor SRAM cell and includes a first inverter 12 and a second inverter 14 connected in a well known cross-coupled latch configuration. First inverter 12 comprises a first P-Channel MOS transistor 16 having a source connected to a first power supply node 18, a gate, and a drain. A first N-Channel MOS transistor 20 has a drain connected to the drain of the first P-Channel MOS transistor 16, a gate, and a source connected to a second power supply node 35 carrying a fixed power supply potential 22 (usually ground). The common drain connection of transistors 16 and 20 comprises an output node 24 of the memory cell.

The second inverter 14 comprises a second P-Channel MOS transistor 26 having a source connected to the first power supply node 18, a gate, and a drain. A second N-Channel MOS transistor 28 has a drain connected to the drain of the second P-Channel MOS transistor 26, a gate, and a source connected to a second power supply node carrying a fixed power supply potential (usually ground). The common drain connection of transistors 26 and 28 comprises a complementary output node 30 of the memory cell. The logic state of complementary output node 30 will be the opposite of the logic state of output node 24.

The gates of first P-Channel and N-Channel MOS transistors 16 and 20 are connected to complementary output node 30 and the gates of second P-Channel and N-Channel MOS transistors 26 and 28 are connected to output node 24. As shown in FIG. 1, an N-Channel pass transistor 32 is connected between output node 24 and a bitline 34. The gate of pass transistor 32 is connected to a wordline 36 driven by an address decoder driver 38. Those of ordinary skill in the art will recognize that the pass transistor 32 could just as easily be connected to complementary output node 30 while observing the device-sizing ratios as disclosed herein. As will be seen herein, the larger inverter is typically used to drive the output.

During normal operation of memory cell 10 of the present invention, the bitline 34 is precharged to a voltage supply potential $V_{CC}=5$ volts. During either a read or a write operation of SRAM cell 10, the voltage supply level $V_{CC}$ is applied to the gate of the pass transistor 32 from address decoder driver 38.

Unlike prior art SRAM memory cells, memory cell 10 of the present invention is powered by one of two power supply potentials, depending on whether a read or a write operation is occurring. According to a presently preferred embodiment of the invention, two voltage supply potentials, $V_{RR}$ and $V_{WW}$, are provided by memory cell power driver circuit 40. Memory cell power driver circuit 40 is controlled by a read/write (R/W) signal on line 42. Such signals are customarily generated in memory arrays containing SRAM memory cells. In an embodiment contemplated using transistors sized as in the example set forth herein, $V_{RR} \approx 7.5$ volts and $V_{WW} \approx 3.5$ volts for standard CMOS technology as currently practiced. Those of ordinary skill in the art will be readily able to scale these voltage values. Numerous circuits are available in the art to provide this two-level power supply function, and one such circuit will be shown herein.

The voltage supply potential $V_{RR}$ is provided to the SRAM cell 10 at all times, except during a write operation. The voltage supply potential $V_{WW}$ is supplied to the SRAM cell 10 only during a write operation. As will be more fully disclosed herein, the ratio of the sizes of N-Channel MOS pass transistor 32 to N-Channel MOS transistor 20 in first inverter 12 is such that the data stored in memory cell 10 will not change during a read operation, and will be written as intended during a write operation, when the voltages $V_{RR}$ and $V_{WW}$ are applied to the cell as disclosed herein.

Figure 2A:
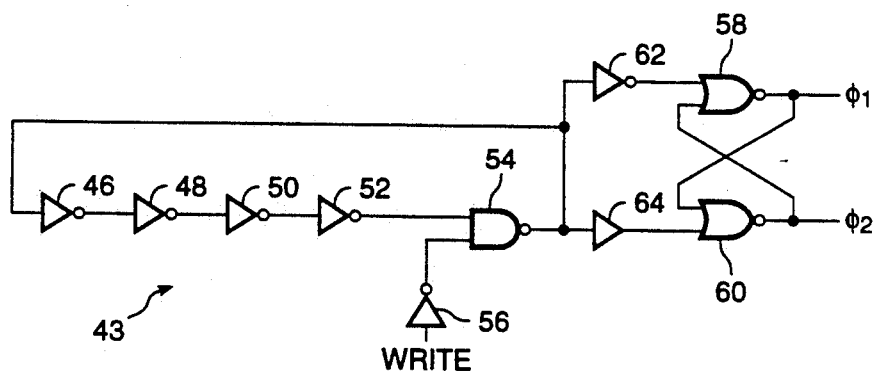
FIG. 2a is a schematic diagram of a ring oscillator circuit suitable for use in a memory cell power driver circuit for the present invention.
Figure 2B:
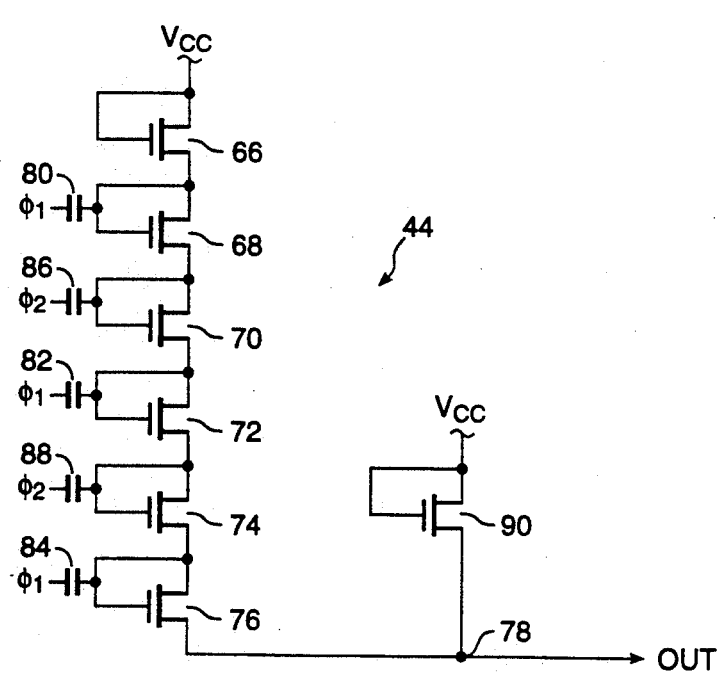
FIG. 2b is a schematic diagram of a charge pump circuit suitable for use in a memory cell power driver circuit for the present invention.

Referring now to FIGS. 2a and 2b, a memory cell power driver circuit 40 implemented as a ring oscillator 43 driving a charge pump 44 is shown. In FIG. 2a, inverters 46, 48, 50 and 52 and NAND gate 54 form an oscillator as is well known in the art. The output of the oscillator may be gated by a logic high signal appearing at the input of inverter 56. Cross-coupled NOR gates 58 and 60 driven by inverters 62 and 64 convert the single clock output of the oscillator to a pair of non-overlapping clock signals $\Phi_1$ and $\Phi_2$.

As may be seen from FIG. 2b, the charge pump 44 comprises a series string of diode-connected N-Channel MOS transistors 66, 68, 70, 72, 74, and 76. The drain and gate of N-Channel MOS transistor 66 is connected to power rail $V_{CC}$. The source of N-Channel MOS transistor 76 is connected to output node 78 of the charge pump. Output node 78 drives the first power supply node 18 of SRAM cell 10 of FIG. 1. MOS capacitors 80, 82, and 84, respectively, couple the $\Phi_1$ clock signal to the gates of N-Channel MOS transistors 68, 72, and 76, and MOS capacitors 86 and 88, respectively, couple the $\Phi_2$ clock signal to the gates of N-Channel MOS transistors 70 and 74. N-Channel MOS transistor 90 has its source connected to output node 78 and its drain and gate connected to $V_{CC}$. Those of ordinary skill in the art will recognize that N-Channel MOS transistor 90 acts as a clamping means to clamp output node 78 to a $V_{TN}$ below $V_{CC}$. This will be about 3.5 volts when $V_{CC}$ is 5 volts. Other known equivalent clamping means may be employed. In addition, those of ordinary skill in the art will be readily able to devise means for clamping the output node 78 without turning off the ring oscillator.

As will be appreciated by those of ordinary skill in the art, ring oscillator 43 is disabled during a write operation when the write signal input to inverter 56 is high. The voltage on output node 78 is supplied through N-Channel MOS transistor 90 and has a value of $V_{WW}=V_{CC}-V_{TN}$ of the N-Channel transistor. During a read operation, the input to inverter 56 is a logic low and the ring oscillator 43 is enabled. In this condition, and the voltage supply potential $V_{RR}$ (approximately 7.5 volts) is provided to the SRAM cell 10.

During a read operation of memory cell 10, the cases of output node 24 being at both a logical low or logic high state must be considered. For a read operation, bitline 34 is precharged to $V_{CC}$ by a conventional bitline driver (not shown). When output node 24 is at a logic high state, the voltage at output node 24 is approximately $V_{RR}$. During the read operation, $V_{CC}$ is applied to the gate of N-Channel MOS pass transistor 32. Since the voltage at output node 24 is approximately $V_{RR}$, N-Channel MOS transistor 32 remains cut-off, and the content of SRAM cell 10 is not disturbed. In the event that the bitline 34 drops one or more threshold voltage levels ($V_{TN}$) of N-Channel MOS pass transistor 32 below $V_{CC}$, N-Channel MOS pass transistor 32 will turn on and the bitline 32 voltage will be pulled up. Thus, a large noise margin is provided for bitline 34.

When output node 24 is at a logical low, the gate of N-Channel MOS transistor 20 is at approximately $V_{PP}$ and its on resistance is low. The voltage level on output node 24 must be kept below the threshold voltage ($V_{TN}$) of N-Channel MOS transistor 20 to ensure that output node 24 remains at a logic low. If, during a read operation, the voltage at output node 24 rises above the threshold voltage of N-Channel MOS transistor 28, then N-Channel MOS transistor 28 will turn on and the voltage at output node 24 will go to a logic high state.

During a read operation, the voltage at output node 24 is determined by the division of Vcc on the bitline by the channel resistances of N-Channel MOS transistors 32 and 20, respectively. The voltage at output node 24 is stays below the threshold voltage of N-Channel MOS transistor 28 when the voltage $V_{RR}$ applied to the gate of N-Channel MOS transistor 20 is high enough to lower its channel resistance to the point that the voltage at output node 24 due to the voltage division does not rise above the threshold voltage of N-Channel MOS transistor 28.

During a write operation, the voltage supply potential provided to the SRAM cell 10 is lowered to $V_{WW}$. In order to maintain the integrity of the data stored in SRAM cell 10, $V_{WW}$ must be greater than the sum of the threshold voltages of second P-Channel MOS transistor 26 and first N-Channel MOS transistor 20.

When the voltage at output node 24 is the same as the voltage being applied to the bitline 34, the writability of the SRAM cell 10 is assured, since no change at output node 24 occurs. However, when the content of the SRAM cell 10 is at a logic state opposite to that of bitline 34, two cases must be considered.

When the voltage level at output node 24 is a logic high, the voltage supplied to the gate of N-Channel MOS transistor 28 is $V_{WW}$. In order to write a logic low data bit to the SRAM cell 10, the voltage supplied to the gate of second N-Channel MOS transistor 28 must be pulled down lower than the threshold voltage of second N-Channel MOS transistor 28 to turn it off. Since the voltage supply potential $V_{WW}$ provided to the gate of N-Channel MOS transistor 28 is relatively low, first P-Channel MOS transistor 16 is only weekly turned on, and output node 24 is easily pulled down to the voltage level on the bitline 34.

When the voltage level at output node 24 is a logic low, the voltage applied to the gate of second N-Channel MOS transistor 28 must be greater than its threshold voltage $V_{TN}$ in order to write a logic high data bit into memory cell 10. The voltage applied to the gate of second N-Channel MOS transistor 28 is determined by the division of the bitline voltage by the channel resistances of N-Channel MOS transistors 32 and 20. The voltage applied to the gate of N-Channel MOS transistor 28 rises above its threshold voltage when the voltage supply potential $V_{WW}$ applied to the gate of N-Channel MOS transistor 20 is low enough to raise its channel resistance to the point that the voltage divider provides a voltage level above the threshold voltage of N-Channel MOS transistor 28.

In an actual embodiment of the present invention fabricated according to a typical 1.0 micron CMOS process and utilizing $V_{CC}=5$ volts and $V_{RR} \approx 7.5$ volts, and wherein the threshold voltage for both the N-Channel and P-Channel MOS transistors is 1.5 volts, the channel lengths of all devices is 1.0 microns. The channel width of N-Channel MOS pass transistor 32 is 5.5 microns. The channel width of second N-Channel MOS transistor 28 is 6.0 microns. The channel width of first N-Channel MOS transistor 20 is 3.0 microns. The channel width of second P-Channel MOS transistor 26 is 12.0 microns and the channel width of first P-Channel MOS transistor 16 is 3.0 microns. This ensures that a read operation of SRAM cell 10 will not change the content of the SRAM cell 10 and a write to the SRAM cell 10 will occur as intended.

As will be appreciated by those of ordinary skill in the art from the foregoing description of the operation of the memory cell of the present invention, the sizing of the transistors of the memory cell of the present invention may be generalized. As long as the two following relationships are satisfied the memory cell of the present invention will function as intended. During a read operation a logic zero is the critical data state at output node 24 and during a write operation a logic one is the critical data state at output node 24. MOS transistors 20 and 32 should be sized to assure that the reading of a logic zero and the writing of a logic one at output node 24 can be done reliably.

More particularly, MOS transistors 20 and 32 should be sized such that their channel resistances in the on state form a voltage divider which assures that the voltage at the output node 24 during a read operation for a logic zero data bit is less than the threshold voltage of an N-Channel MOS transistor used in the process when the inverter is powered by $V_{RR}$, that their channel resistances in the on state form a voltage divider which assures that the voltage at the output node 24 during a write operation which replaces a logic zero data bit with a logic one data bit at node 24 of the memory cell is greater than the threshold voltage of N-Channel MOS transistor 28 when the inverter is powered by $V_{WW}$. Those of ordinary skill in the art will recognize that the voltage divider analysis disclosed herein must take into account the output impedance of the bitline driver circuit (not shown). In practive in well designed memory circuits, this impedance should be low enough such that it will not appreciable affect the relationships disclosed herein. The sizes of P-Channel MOS transistors 16 and 26 and N-Channel MOS transistor 28 may be selected using standard SRAM cell design considerations after determining the sizes of N-Channel MOS transistors 20, and 32 according to the present invention.

Figure 3:
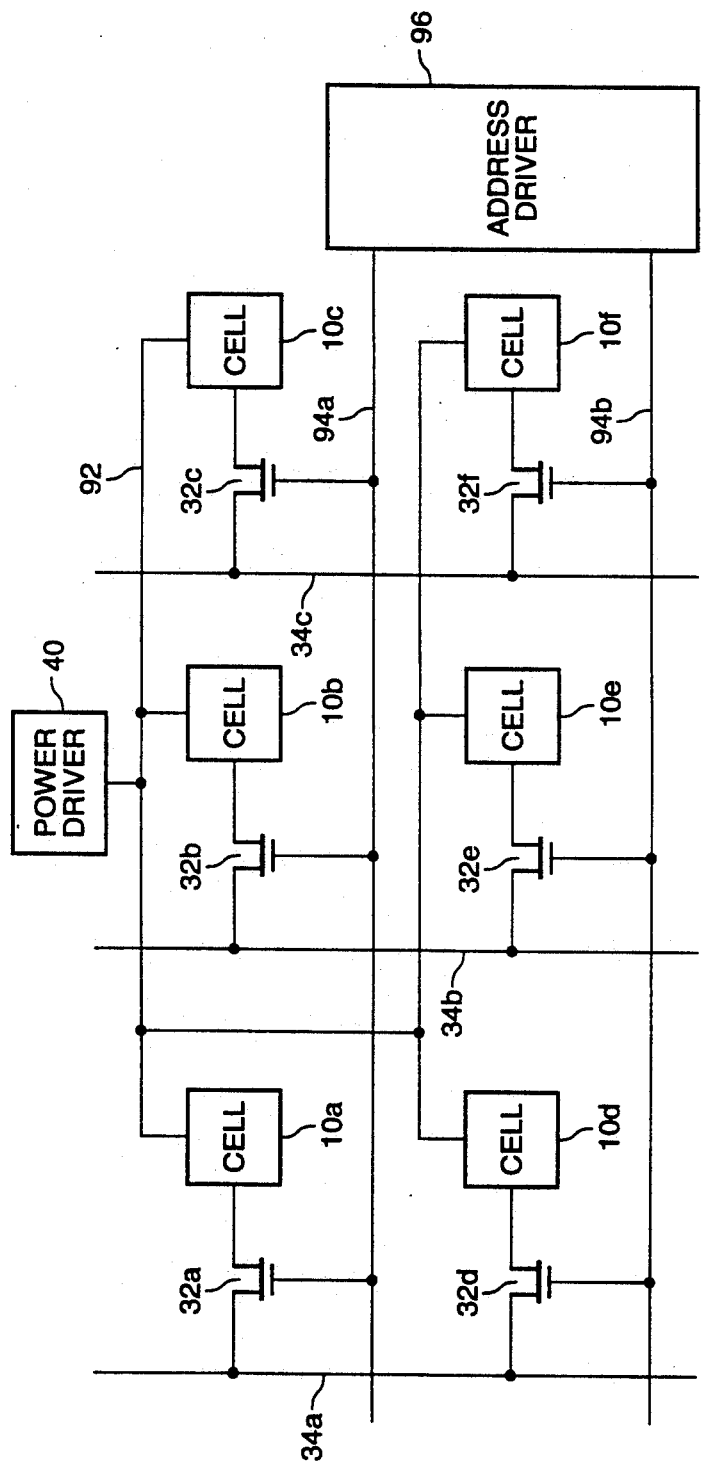
FIG. 3 is a block diagram showing a plurality of SRAM memory cells according to the present invention connected to a common power supply driver circuit.

Those of ordinary skill in the art will also recognize that a major advantage of the present invention is the ability to avoid the necessity to provide individual power supplies for each address line driver. Referring now to FIG. 3, a block diagram shows a plurality of memory cells 10a, 10b, 10c, 10d, 10e and 10f arranged in an array of two rows and three columns and connected to the same power driver circuit 40 via a common power bus 92. Memory cells 10a, 10b, 10c, 10d, 10e and 10f are shown connected to bitlines 34a, 34b and 34c through pass transistors 32a, 32b, 32c, 32d, 32e, and 32f. The gates of the pass transistors in the first row of the array are connected to address line 94a and the gates of the pass transistors in the second row of the array are connected to address line 94b. Address lines 94a and 94b are driven by address driver circuits 96a and 96b.

Those of ordinary skill in the art will recognize that the array shown in FIG. 3 is merely a convenient generalization, and that, in an actual embodiment of this aspect of the present invention implemented on an integrated circuit, one or more power driver circuits 40 could each drive one or more memory cells and that more than one memory cell could be coupled to the same bitline, as dictated by design choices.

One of the advantages of the present invention may be seen with reference to FIG. 3. Address driver circuits 96a and 96b do not need to include the extra circuit overhead necessary for the address driver circuits shown, for example, in U.S. Pat. No. 4,750,155. In larger integrated systems which employ many address drivers, such circuit overhead can become significant.

As those of ordinary skill in the art will appreciate from an examination of the within disclosure, it is possible to overcome the transistor sizing conflict for reading and writing operations because $V_{RR}$ is greater than $V_{WW}$ so that (assuming a logic zero at output node 24) N-channel MOS transistor 20 is turned on more strongly during zero bit read operations than during write operations which replace a logic zero data bit with a logic one data bit. This results in the desirable property that its channel resistance is less during read operations than it is during such write operations. As a result, output node 24 is easy to overwrite during write operations and hard to disturb during read operations.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A memory cell comprising:
   first and second cross-coupled inverters coupled to a bit line through a pass transistor, said first cross-coupled inverter including a first P-Channel MOS transistor having a source connected to a first power supply node, a gate, and a drain, and a first N-Channel MOS transistor having a gate, a drain connected to the drain of said first P-Channel MOS transistor and forming an output node, and a source connected to a second power supply node, said second cross-coupled inverter including a second P-Channel MOS transistor having a source connected to said first power supply node, a gate, and a drain, and a second N-Channel MOS transistor having a drain connected to the drain of said second P-Channel MOS transistor and forming an internal node, a source connected to said second power supply node, and a gate, the gates of said first N-Channel and P-Channel MOS transistors connected to said internal node and the gates of said second N-Channel and P-Channel MOS transistors connected to said output node;
   means for providing a first voltage supply potential to said first power supply node during a read operation of the memory cell, and for providing a second voltage supply potential to said first power supply node during a write operation to the memory cell, the second voltage supply potential having a value less than the first voltage supply potential; and
   wherein the magnitudes of said first and second voltage supply potentials and wherein said pass transistor and said first N-Channel MOS transistor have channel lengths and widths selected such that the voltage at said output node remains below an N-Channel threshold voltage during a read operation of a logic zero at said output node while said memory cell is powered by said first voltage supply potential, and that the voltage at said output node remains above an N-Channel threshold voltage during a write operation of a logic one at said output node while said memory cell is powered by said second voltage supply potential.

2. A memory cell as in claim 1, wherein said means for providing said first and second voltage supply potentials comprises a clampable charge pump means.

3. A memory cell as in claim 2 wherein said clampable charge pump means comprises a charge pump having a charge pump output connected to said first power supply node, said charge pump driven by a ring oscillator and wherein said charge pump output node is clamped to a fixed voltage through a diode-connected MOS transistor.

* * * * *